(12) United States Patent
Kim et al.

(10) Patent No.: US 10,707,448 B2
(45) Date of Patent: *Jul. 7, 2020

(54) ORGANIC LIGHT-EMITTING DIODE AND DISPLAY DEVICE COMPRISING THE SAME

(71) Applicant: LG Display Co., Ltd., Seoul (KR)

(72) Inventors: JiYoung Kim, Seongnam-si (KR); SeUng Kim, Seoul (KR); JungSoo Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/525,461

(22) Filed: Jul. 29, 2019

(65) Prior Publication Data

US 2019/0348640 A1    Nov. 14, 2019

Related U.S. Application Data

(63) Continuation of application No. 16/022,081, filed on Jun. 28, 2018, now Pat. No. 10,418,593.

(30) Foreign Application Priority Data

Jun. 30, 2017    (KR) .......................... 10-2017-0083678

(51) Int. Cl.
    *H01L 51/52*    (2006.01)
    *H01L 51/50*    (2006.01)
    *H01L 27/32*    (2006.01)

(52) U.S. Cl.
    CPC ........ *H01L 51/5278* (2013.01); *H01L 51/504* (2013.01); *H01L 51/5044* (2013.01);
    (Continued)

(58) Field of Classification Search
    CPC ............... H01L 51/5278; H01L 51/504; H01L 51/5044; H01L 2251/5376;
    (Continued)

(56) References Cited

U.S. PATENT DOCUMENTS 10,418,593 B2 *   9/2019   Kim .................... H01L 51/5278
2008/0297036 A1   12/2008  Noh et al.
(Continued)

FOREIGN PATENT DOCUMENTS

KR    10-2013-0073808 A    7/2013
KR    10-2017-0031362 A    3/2017

OTHER PUBLICATIONS

German Patent and Trademark Office, Office Action, DE Patent Application No. 102018113854.7, dated Jan. 17, 2019, 17 pages.
(Continued)

*Primary Examiner* — Jasmine J Clark
(74) *Attorney, Agent, or Firm* — Fenwick & West LLP

(57) ABSTRACT

An organic light-emitting diode includes a first electrode, a first light-emitting unit (EL unit) disposed on the first electrode and including a first organic light-emitting layer, a first charge generating layer on the first EL unit, a second EL unit disposed on the first charge generating layer and including a second organic light-emitting layer, a third organic light-emitting layer and a fourth organic light-emitting layer, a second charge generating layer on the second EL unit, a third EL unit disposed on the second charge generating layer and including a fifth organic light-emitting layer, and a second electrode on the third EL unit. A dopant concentration of the third organic light-emitting layer is greater than a dopant concentration of the fourth organic light-emitting layer. An organic light emitting display device can include the organic light-emitting diode.

6 Claims, 7 Drawing Sheets

(52) U.S. Cl.
CPC ...... *H01L 27/3244* (2013.01); *H01L 51/5016* (2013.01); *H01L 2251/5376* (2013.01); *H01L 2251/5384* (2013.01); *H01L 2251/558* (2013.01)

(58) Field of Classification Search
CPC ....... H01L 2251/558; H01L 2251/5384; H01L 51/5016; H01L 27/3244; H01L 51/5024
See application file for complete search history.

(56) References Cited

U.S. PATENT DOCUMENTS

| | | |
|---|---|---|
| 2014/0167016 A1 | 6/2014 | Yoo et al. |
| 2015/0060825 A1 | 3/2015 | Song et al. |
| 2017/0077434 A1 | 3/2017 | Kim et al. |
| 2018/0061911 A1 | 3/2018 | Sun et al. |

OTHER PUBLICATIONS

United States Office Action, U.S. Appl. No. 16/022,081, dated Jan. 10, 2019, eight pages.

\* cited by examiner

ORGANIC LIGHT-EMITTING DIODE AND DISPLAY DEVICE COMPRISING THE SAME

CROSS-REFERENCE TO RELATED APPLICATIONS

This application is a continuation of U.S. application Ser. No. 16/022,081, filed on Jun. 28, 2018, which claims priority to Republic of Korea Patent Application No. 10-2017-0083678 filed on Jun. 30, 2017, in the Republic of Korea Intellectual Property Office, all of which are incorporated herein by reference in their entirety.

TECHNICAL FIELD

The present disclosure relates to an organic light-emitting diode and an organic light-emitting display device including the same. More particularly, the present disclosure relates to an organic light-emitting diode with improved efficiency and lifetime, and an organic light-emitting display device including the same.

BACKGROUND

An organic light-emitting display device does not require an additional light source unlike a liquid-crystal display device and thus can be made lighter and thinner. Further, an organic light-emitting display device has advantages in that it is driven with low voltage to consume less power, and in that it represents vivid colors, has short response time, wide viewing angle and good contrast ratio (CR). For these reasons, an organic light-emitting display device is currently under development as the next generation display device.

An organic light-emitting display device is a self-luminance display device. An organic light-emitting display device utilizes an organic light-emitting diode in which electrons from a cathode and holes from an anode are injected into an emitting layer, and the electrons and holes recombine to form excitons, such that light is emitted when the excitons transition from an excited state to the ground state.

Organic light-emitting display devices can be sorted into a top-emission organic light-emitting display device, a bottom-emission organic light-emitting display device and a dual-emission organic light-emitting display device depending on the direction in which light exits. Further, organic light-emitting display devices can be sorted into an active matrix organic light-emitting display device and a passive matrix organic light-emitting display device depending on the driving manner.

As display devices have higher and higher resolution, the number of pixels per unit area increases, and a high luminance is required. However, the current per area is limited by the emission structure of an organic light-emitting display device. In addition, as the amount of applied current increases, reliability of an organic light-emitting display device is degraded, and the power consumption increases.

In view of the above, a variety of structures for organic light-emitting diodes have been proposed for increasing the efficiency and lifetime of organic light-emitting diodes while reducing power consumption.

Specifically, in addition to a single-stack architecture that employs a single stack, i.e., a single light-emitting unit (EL unit), a multi-stack architecture has been proposed that employs multiple stacks, i.e., a plurality of EL units for improving efficiency and elongating lifetime.

In an organic light-emitting diode employing a multi-stack architecture including a stack of multiple EL units, an emission zone where light is emitted by recombination of electrons and holes is disposed in each of the multiple EL units. Therefore, the organic light-emitting diode having a multi-stack architecture can exhibit higher efficiency than existing organic light-emitting diodes having a single-stack architecture. In addition, it can be driven with a low current, and thus the lifetime can be improved.

However, if the amount of dopants doped into each of the plurality of EL units is not appropriate, electrons and holes are not balanced in the EL units. As a result, problems may arise in the efficiency, driving voltage and lifetime characteristics of the organic light-emitting diodes.

SUMMARY

In view of the above, an object of the present disclosure is to provide an organic light-emitting diode with improved efficiency and lifetime by way of optimizing a doping concentration of each of a plurality of EL units, and an organic light-emitting display device including the same.

Another object of the present disclosure is to provide an organic light-emitting diode with uniform luminous efficiency in a low current density region by way of adjusting a doping concentration of a dopant of each of a plurality of EL units, and an organic light-emitting display device including the same.

It should be noted that objects of the present disclosure are not limited to the above-described objects, and other objects of the present disclosure will be apparent to those skilled in the art from the following descriptions.

According to an aspect of the present disclosure, there is provided an organic light-emitting diode including a first electrode; a first light-emitting unit (EL unit) disposed on the first electrode and comprising a first organic light-emitting layer; a first charge generating layer on the first EL unit; a second EL unit disposed on the first charge generating layer and comprising a second organic light-emitting layer, a third organic light-emitting layer and a fourth organic light-emitting layer; a second charge generating layer on the second EL unit; a third EL unit disposed on the second charge generating layer and comprising a fifth organic light-emitting layer; and a second electrode on the third EL unit. A dopant concentration of the third organic light-emitting layer is greater than a dopant concentration of the fourth organic light-emitting layer. By limiting the concentration of dopants as described above, the uniformity of luminous efficiency of the organic light-emitting diode can be improved without reducing the lifetime.

According to an aspect of the present disclosure, there is provided an organic light-emitting display device including: a substrate; and an organic light-emitting diode on the substrate. The organic light-emitting diode includes a first electrode; a first fluorescent EL unit disposed on the first electrode and comprising a first hole transport layer, a first blue light-emitting layer and a first electron transport layer; a first charge generating layer on the first fluorescent EL unit; a phosphorescent EL unit disposed on the first charge generating layer and comprising a second hole transport layer, a red light-emitting layer, a first yellow-green light-emitting layer, a second yellow-green light-emitting layer and a second electron transport layer; a second charge generating layer on the phosphorescent EL unit; a second fluorescent EL unit disposed on the second charge generating layer and comprising a third hole transport layer, a second blue light-emitting layer and a third electron transport layer; and a second electrode on the second fluorescent EL unit. A dopant concentration of the first yellow-green light-emitting layer ranges from 25% to 28%. As a result, the luminous efficiency can be uniform in a low current density region.

The details of one or more embodiments of the subject matter described in this specification are set forth in the accompanying drawings and the description below.

According to an exemplary embodiment of the present disclosure, in an organic light-emitting diode having a multi-stack architecture employing a fluorescent EL unit and a phosphorescent EL unit, the efficiency roll-off is improved in a low current density region by adjusting the dopant concentration of the phosphorescent EL unit.

According to another exemplary embodiment of the present disclosure, in an organic light-emitting diode employing a plurality of EL units, the luminous efficiency of red light and green light is improved by adjusting the dopant concentration of the EL units that emit red light and yellow-green light.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
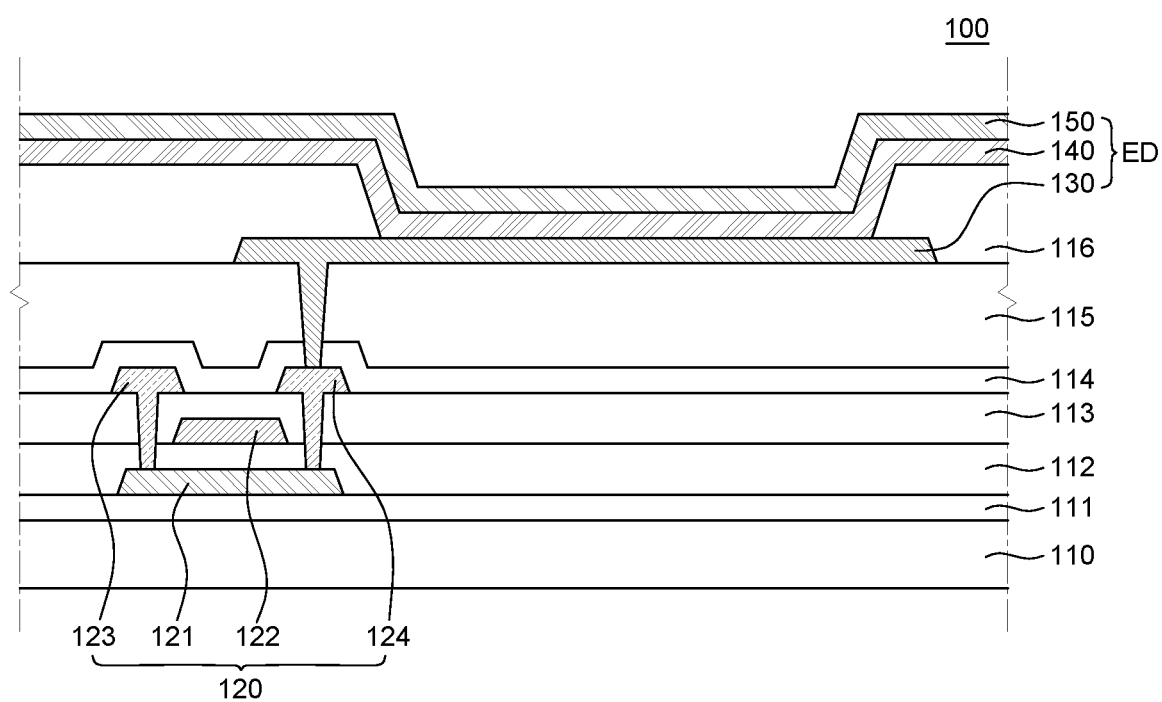
FIG. 1 is a cross-sectional view of an OLED device according to an exemplary embodiment of the present disclosure.

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

As used herein, the terms first, second, etc., are used for distinguishing between similar elements and not necessarily for describing a sequential or chronological order. Theses terms are used to merely distinguish one element from another. Accordingly, as used herein, a first element may be a second element within the technical scope of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

FIG. 1 is a cross-sectional view of an OLED device according to an exemplary embodiment of the present disclosure; Referring to FIG. 1, an organic light-emitting display device 100 according to an exemplary embodiment of the present disclosure includes a substrate 110, a thin-film transistor 120, and an organic light-emitting diode (ED). For convenience of illustration, FIG. 1 shows the cross-sectional view of a signal sub-pixel of the organic light-emitting display device 100.

The substrate 110 supports thereon a variety of elements of the organic light-emitting display device 100. The substrate 110 may be made of an insulating material. For example, the substrate 110 may be made of glass or a plastic material such as polyimide (PI).

A buffer layer 111 is disposed on the substrate 110. The buffer layer 111 enhances the adhesion between the substrate 110 and the layers formed thereon, and blocks alkaline components or the like leaking out of the substrate 110. The buffer layer 111 may be a single layer of silicon nitride (SiNx) or silicon oxide (SiOx) which is an inorganic material, or multiple layers of silicon nitride (SiNx) and silicon oxide (SiOx). It is to be understood that the buffer layer 111 is not an essential component and may be eliminated depending on the type and material of the substrate 110, the structure and type of the thin-film transistor 120, etc.

The thin-film transistor 120 is disposed on the buffer layer 111. The thin-film transistor 120 includes an activate layer 121, a gate electrode 122, a source electrode 123, and a drain electrode 124. The thin-film transistor 120 is a driving thin-film transistor and has a top gate structure in which the gate electrode 122 is disposed on the active layer 121. Although FIG. 1 shows only the driving thin-film transistor among a variety of thin-film transistors that may be included in the organic light-emitting display device 100 for the sake of convenience, it is to be understood that other thin-film transistors such as a switching thin-film transistor may also be included in the organic light-emitting display device 100.

In addition, although the thin-film transistor 120 has a coplanar structure, the thin-film transistor may have other structures such as a staggered structure.

The active layer 121 of the thin-film transistor 120 is disposed on the buffer layer 111, and the gate insulating layer 112 for insulating the gate electrode 122 from the active layer 121 is disposed over the active layer 121 and the buffer layer 111.

The active layer 121 may be made of an amorphous silicon (a-Si), a polycrystalline silicon (poly-Si), an oxide semiconductor, an organic semiconductor, or the like. When the active layer 121 is formed of a metal oxide, the active layer 121 may be formed of, but is not limited to, indium tin oxide (ITO), indium zinc oxide (IZO), indium gallium zinc oxide (IGZO), indium tin zinc oxide (ITZO), etc.

The gate insulating layer 112 insulates the active layer 121 from the gate electrode 122. The gate insulating layer 112 may be made up of a single layer of silicon nitride (SiNx) or silicon oxide (SiOx) which is an inorganic material, or multiple layers of silicon nitride (SiNx) and silicon oxide (SiOx). It is, however, to be understood that the present disclosure is not limited thereto.

Contact holes are formed in the gate insulating layer 112, via which the source electrode 123 and the drain electrode 124 are in contact with the active layer 121, respectively. Although the gate insulating layer 112 is depicted as being flat in FIG. 1 for convenience of illustration, the gate insulating layer 112 may have a shape conforming to the shapes of elements disposed thereunder.

The gate electrode 122 is disposed on the gate insulating layer 112. The gate electrode 122 may be made of, but is not limited to, a conductive metal such as copper (Cu), aluminum (Al) and molybdenum (Mo), or an alloy thereof. The gate electrode 122 may be disposed on the gate insulating layer 112 so that it overlaps with the active layer 121.

An interlayer dielectric layer 113 for insulating the gate electrode 122 from the source electrode 123 and the drain electrode 124 is disposed on the gate electrode 122. The interlayer dielectric layer 113 may be made up of a single layer of silicon nitride (SiNx) or silicon oxide (SiOx) which is an inorganic material, or multiple layers of silicon nitride (SiNx) and silicon oxide (SiOx). It is, however, to be understood that the present disclosure is not limited thereto. Contact holes may be formed in the interlayer dielectric layer 113, via which the source electrode 123 and the drain electrode 124 are in contact with the active layer 121, respectively. Although the interlayer dielectric layer 113 is depicted as being flat in FIG. 1 for convenience of illustration, the interlayer dielectric layer 113 may have a shape conforming to the shapes of elements disposed thereunder.

The source electrode 123 and the drain electrode 124 are disposed on the interlayer dielectric layer 113. The source electrode 123 and the drain electrode 124 may be made of, but is not limited to, a conductive metal such as copper (Cu), aluminum (Al) and molybdenum (Mo), or an alloy thereof. The source electrode 123 and the drain electrode 124 may be electrically connected to the active layer 121 via the contact holes, respectively.

A passivation layer 114 may be disposed over the thin-film transistor 120. The passivation layer 114 is an insulating layer for protecting the thin-film transistor 120. The passivation layer 114 may be made up of a single layer of silicon nitride (SiNx) or silicon oxide (SiOx) which is an inorganic material, or multiple layers of silicon nitride (SiNx) and silicon oxide (SiOx). It is, however, to be understood that the present disclosure is not limited thereto. The passivation layer 114 may include a contact hole via which a first electrode 130 of the organic light-emitting diode ED is connected to the thin-film transistor 120. It is to be noted that the passivation layer 114 is not an essential element and thus may be eliminated depending on the design of the organic light-emitting display device 100.

A planarization layer 115 is disposed on the passivation layer 115. The planarization layer 115 is an insulating layer for providing a flat surface over the thin-film transistor 120 and may be made of an organic material. The planarization layer 115 may provide a flat surface over the thin-film transistor 120, so that the organic light-emitting diode ED can be formed more reliably. A contact hole for exposing the drain electrode 124 of the thin-film transistor 120 is formed in the planarization layer 115.

The organic light-emitting diode ED including a first electrode 130, an organic light-emitting layer, and a second electrode 150, and a bank 116 are disposed on the planarization layer 115.

The organic light-emitting diode ED emits light in an emission zone defined by the bank 116. In other words, light can be emitted only in a region of the first electrode 130 of the organic light-emitting diode ED that is not covered by the bank 116.

The plurality of EL units 140 is disposed between the first electrode 130 and the second electrode 150. Each of the plurality of EL units 140 is a minimum unit for emitting light and may include a variety of organic layers as needed. For example, each of the plurality of EL units 140 may include an organic light-emitting layer (EML), at least one hole transport layer, and an electron transport layer. The organic light-emitting diode ED including the plurality of EL units 140 is an organic light-emitting diode for emitting white light.

Although not shown in FIG. 1, the organic light-emitting display device 100 may further include a color filter disposed above or below the organic light-emitting diode ED. The location of the color filter may be determined based on the direction in which light exits from the organic light-emitting display device 100. The color filter layer is to convert the color of the light emitted from an organic light-emitting layer and may be one of a red color filter, a green color filter, and a blue color filter. The color filter may be formed within the emission zone of the organic light-emitting diode ED.

Hereinafter, the architecture of an organic light-emitting diode ED according to an exemplary embodiment of the present disclosure will be described in detail with reference to FIG. 2.

Figure 2:
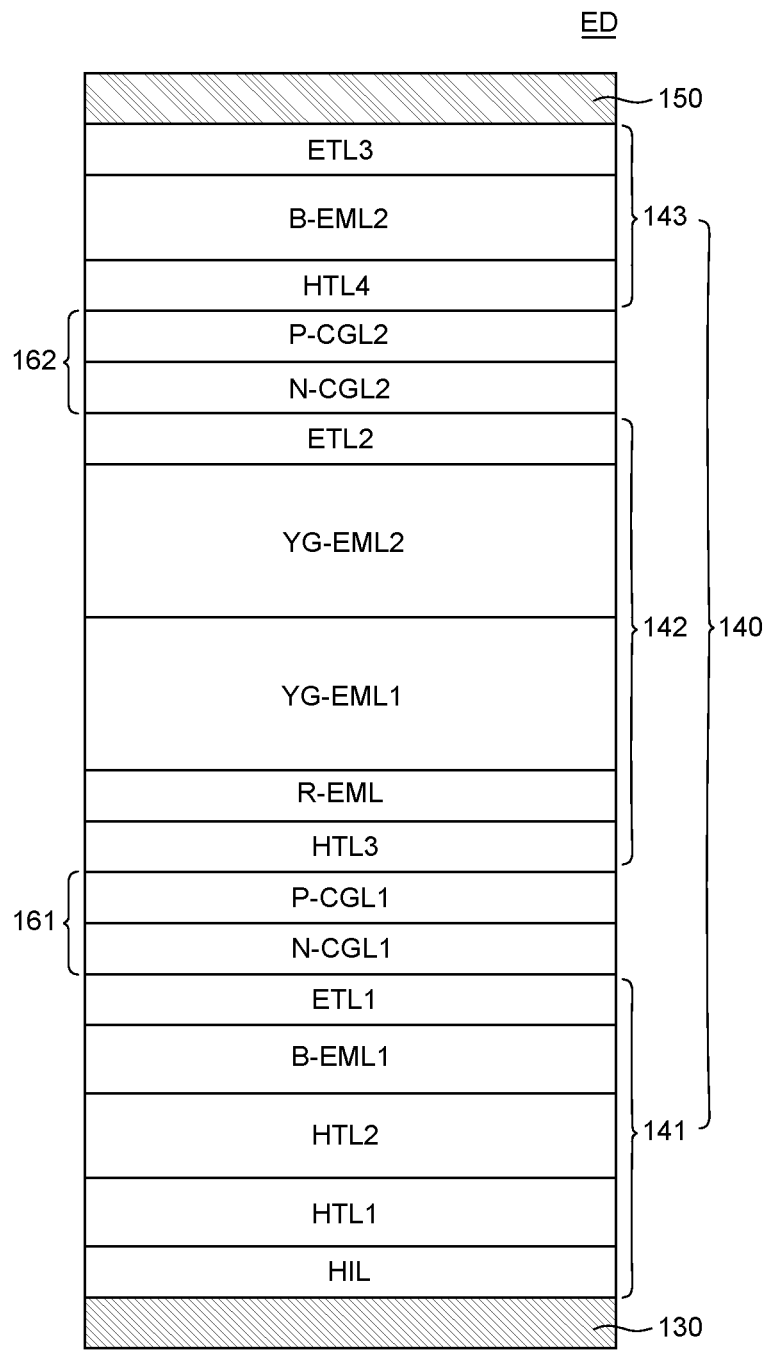
FIG. 2 is a view schematically showing the structure of an organic light-emitting diode according to an exemplary embodiment of the present disclosure.

FIG. 2 is a view schematically showing an architecture of an organic light-emitting diode ED according to an exemplary embodiment of the present disclosure. Referring to FIG. 2, an organic light-emitting diode ED includes a first electrode 130, a second electrode 150 and a plurality of light-emitting units (EL units) 140.

The first electrode 130 supplies holes to the plurality of EL units 140. That is to say, the first electrode 130 is an anode that supplies holes to the first EL unit 141 of the plurality of EL units 140. The first electrode 130 may be made of a transparent conductive material having a high work function. For example, the first electrode 130 may be made of, but is not limited to, a transparent conductive material such as tin oxide (TO), indium tin oxide (ITO), indium zinc oxide (IZO) and indium zinc tin oxide (IZTO). In some exemplary embodiments of the present disclosure where the organic light-emitting diode ED is employed by a top-emission organic light-emitting display device, a reflective layer made of highly reflective material such as silver (Ag) or a silver alloy may be disposed under the first electrode 130.

The second electrode 150 supplies electrons to the plurality of EL units 140. That is to say, the second electrode 150 is a cathode that supplies electrons to the third EL unit 143 of the plurality of EL units 140. The second electrode 150 may be made of a conductive material having a low work function. For example, the second electrode 150 may be made of at least one selected from the group consisting of opaque, conductive metals such as magnesium (Mg), silver (Ag), aluminum (Al) and calcium (Ca), and an alloy thereof. For example, the second electrode 150 may be made of an alloy of magnesium and silver (Mg: Ag). Alternatively, the second electrode 150 may be made up of, but is not limited to, a plurality of layers, being made of a transparent conductive oxide (TCO), indium tin oxide (ITO), indium zinc oxide (IZO), indium gallium zinc oxide (IGZO), and metal materials such as gold (Au), silver (Ag), aluminum (Al), molybdenum (Mo) and magnesium (Mg).

When the organic light-emitting diode ED is employed by a top-emission organic light-emitting display device, the second electrode 150 may have transparent or transflective property such that light generated in the first EL unit 141, the second EL unit 142 and the third EL unit 143 passes through the second electrode 150 to exit.

The plurality of EL units 140 is disposed between the first electrode 130 and the second electrode 150. Each of the plurality of EL units 140 is a region where light is emitted by the combination of the holes supplied from the first electrode and the electrons supplied from the second electrode 150. The plurality of EL units 140 includes a first EL unit 141, a second EL unit 142, and a third EL unit 143.

Charge generating layers 161 and 162 are disposed between adjacent ones of the EL units 141, 142 and 143, so that the plurality of EL units 140 can receive charges from the charge generating layers 161 and 162. Specifically, a first charge generating layer 161 is disposed between the first EL unit 141 and the second EL unit 142, and a second charge generating layer 162 is disposed between the second EL unit 142 and the third EL unit 143. The first EL unit, the second EL unit and the third EL unit may receive charges from the first charge generating layer 161 and the second charge generating layer 162.

The light emitted from each of the plurality of EL units 140 may be mixed together to represent the light finally emitted from the plurality of EL units 140. Therefore, the design of the plurality of EL units 140 may be altered depending on the color of light to be represented.

The first EL unit 141 includes a hole injection layer HIL disposed on the first electrode 130, a first hole transport layer HTL1, a second hole transport layer HTL2, a first organic light-emitting layer B-EML1, and a first electron transport layer ETL1. As will be described below, the first organic light-emitting layer is a fluorescent emitting layer, and accordingly the first EL unit 141 may be defined as a fluorescent EL unit.

The hole injection layer HIL is disposed on the first electrode 130. The hole injection layer HIL is an organic layer that facilitates injection of holes from the first electrode 130 into the first organic light-emitting layer B-EML1. The hole injection layer HIL may be made of, but is not limited to, a material including at least one selected from the group consisting of: HAT-CN(dipyrazino[2,3-f:2',3'-h]quinoxaline-2,3,6,7,10.11-hexacarbonitrile), CuPc(phthalocyanine), F4-TCNQ(2,3,5,6-tetrafluoro-7,7,8,8-tetracyano-quinodimethane), and NPD(N,N'-bis(naphthalene-1-yl)-N,N'-bis(phenyl)-2,2'-dimethylbenzidine.

The first hole transport layer HTL1 is disposed on the hole injection layer HIL. The second hole transport layer HTL2 is disposed on the first hole transport layer HTL1. The first hole transport layer HTL1 and the second hole transport layer HTL2 are organic layers that facilitate transfer of holes from the hole injection layer HIL to the first organic light-emitting layer B-EML1. The first hole transport layer HTL1 and the second hole transport layer HTL2 may be made of, but is not limited to, a material including at least one selected from the group consisting of: NPD(N,N'-bis(naphthalene-1-yl)-N,N'-bis(phenyl)-2,2'-dimethylbenzidine), TPD(N,N'-bis-(3-methylphenyl)-N,N'-bis(phenyl)-benzidine), s-TAD (2,2',7,7'-tetrakis(N,N-dimethylamino)-9,9-spirofluorene) and MTDATA(4,4',4"-Tris(N-3-methylphenyl-N-phenylamino)-triphenylamine) Although FIG. 2 shows that the first hole transport layer HTL1 and the second hole transport layer HTL2 both are used, only one of the first hole transport layer HTL1 and the second hole transport layer HTL2 may be used depending on the design of the organic light-emitting diode ED.

The second hole transport layer HTL2 may work as an electron blocking layer EBL. The electron blocking layer is an organic layer that suppresses electrons injected into the first organic light-emitting layer B-EML1 from overflowing to the first hole transport layer HTL1 and the second hole transport layer HTL2. The electron blocking layer can improve the bonding of holes and electrons in the first organic light-emitting layer B-EML1 by suppressing the movement of electrons and can improve the luminous efficiency of the first organic light-emitting layer B-EML1. It is to be understood that the electron blocking layer may be disposed as a separate layer from the second hole transport layer HTL2.

In the first organic light-emitting layer B-EML1, the holes supplied from the first electrode 130 and the electrons supplied from the second electrode 150 are recombined, so that excitons are generated. The region where the excitons are generated may be referred to as an emission zone or a recombination zone.

The first organic light-emitting layer B-EML1 is disposed between the second hole transport layer HTL2 and the first electron transport layer ETL1. The first organic light-emitting layer B-EML1 is a fluorescent emitting layer, is disposed at a position of the first EL unit 141 where excitons are formed, and includes a material that emits light of a particular color. The first organic light-emitting layer B-EML1 may include a material capable of emitting blue light.

The first organic light-emitting layer B-EML1 may have a host-dopant system, in which a light-emitting dopant material is doped into a host material occupying a large weight ratio so that the light-emitting dopant material has a small weight ratio.

The first organic light-emitting layer B-EML1 may include either a plurality of host materials or a single host material. The first organic light-emitting layer B-EML1 comprising a plurality of host materials or a single host material is doped with a blue fluorescent dopant material. That is to say, the first organic light-emitting layer B-EML1 is a blue light-emitting layer, and the wavelength range of light emitted from the first organic light-emitting layer B-EML1 may be 440 nm to 480 nm.

The blue fluorescent dopant material is a substance capable of emitting blue light. The EL spectrum of the light emitted from the first organic light-emitting layer B-EML1 doped with the blue fluorescent dopant material may have a peak in the blue wavelength region, a peak in the wavelength region corresponding to dark blue color, or a peak in the wavelength region corresponding to sky-blue color.

The blue fluorescent dopant material may be made of, but is not limited to, a material including at least one selected from the group consisting of: a pyrene series substituted with an arylamine-based compound, (4,6-F2ppy)2Irpic, FIrPic(bis(3,5-difluoro-2-(2-pyridyl)phenyl-(2-carboxy-pyridyl) iridium), an iridium (Ir) ligand complex comprising Ir(ppy)$_3$(fac-tris(2-phenylpyridine)iridium)(tris(2-phenylpyridine)iridium), spiro-DPVBi, spiro-6P, spiro-BDAVBi(2,7-bis[4-(diphenylamino)styryl]-9,9'-spirofluorene), distyrylbenzene (DSB), distyrylarylene (DSA), PFO-based polymer, and PPV-based polymer.

The first electron transport layer ETL1 is disposed on the first organic light-emitting layer B-EML1. The first electron transport layer ETL1 receives electrons from a first n-type charge generating layer N-CGL1 to be described below. The first electron transport layer ETL1 transfers the received electrons to the first organic light-emitting layer B-EML1.

In addition, the first electron transport layer ETL1 may work as a hole blocking layer HBL. The hole blocking layer can suppress the holes that have not participated in recombination in the first organic light-emitting layer B-EML1 from leaking.

The first electron transport layer ETL1 may be made of, but is not limited to, at least one selected from the group consisting of: Liq(8-hydroxyquinolinolato-lithium), PB(2-(4-biphenyl)-5-(4-tert-butylphenyl)-1,3,4-oxadiazole), TAZ (3-(4-biphenyl)4-phenyl-5-tert-butylphenyl-1,2,4-triazole), BCP(2,9-Dimethyl-4,7-diphenyl-1,10-phenanthroline) and BAlq(bis(2-methyl-8-quinolinolate)-4-(phenylphenolato) aluminium). The electron transport layer may be eliminated depending on the structure and characteristics of the organic light-emitting display device 100.

The first charge generating layer 161 is disposed between the first EL unit 141 and the second EL unit 142. The first charge generating layer 161 supplies charges to the first EL unit 141 and the second EL unit 142 to adjust the charge balance in the first EL unit 141 and the second EL unit 142.

The first charge generating layer 161 includes a first n-type charge generating layer N-CGL1 and a first p-type charge generating layer P-CGL1. The first n-type charge generating layer N-CGL1 is disposed on the first electron transport layer ETL1. The first p-type charge generating layer P-CGL1 is disposed between the first n-type charge generating layer N-CGL1 and the third hole transport layer HTL3. The first charge generating layer 161 may be made up of a plurality of layers including the first n-type charge generating layer N-CGL1 and the first p-type charge generating layer P-CGL1, but the present disclosure is not limited thereto. It may be made up of a single layer.

The first n-type charge generating layer N-CGL1 injects electrons into the first EL unit 141. The first n-type charge generating layer N-CGL1 may include an n-type dopant material and an n-type host material. The n-type dopant material may be metals in Groups I and II in the Periodic Table, an organic material to which electrons can be injected, or a mixture thereof. For example, the n-type dopant material may be alkali metal or alkali earth metal. That is, the n-type charge generating layer may be, but is not limited to, an organic layer doped with an alkali metal such as lithium (Li), sodium (Na), potassium (K) and cesium (Cs), or an alkali earth metal such as magnesium (Mg), strontium (Sr), barium (Ba) and radium (Ra). For example, the n-type host material may be made of a material capable of delivering electrons including, but is not limited to, at least one of Alq$_3$(tris(8-hydroxyquinolino)aluminum), Liq (8-hydroxyquinolinolato-lithium), PBD(2-(4-biphenylyl)-5-(4-tert-butylphenyl)-1,3,4oxadiazole), TAZ(3-(4-biphenyl) 4-phenyl-5-tert-butylphenyl-1,2,4-triazole), spiro-PBD, and BAlq(bis(2-methyl-8-quinolinolate)-4-(phenylphenolato) aluminium), SAlq, TPB i(2,2',2"-(1,3,5-benzinetriyl)-tris(1-phenyl-1-H-benzimidazole), oxadiazole, triazole, phenanthroline, benzoxazole or benzthiazole.

The first p-type charge generating layer P-CGL1 injects holes into the second EL unit 142. The first p-type charge generating layer P-CGL1 may include a p-type dopant material and a p-type host material. The p-type dopant material may be made of, but is not limited to, a metal oxide, an organic material such as tetra(fluoro)-tetra(cyano) quinodimethane (F4-TCNQ), HAT-CN (Hexaazatriphenylene-hexacarbonitrile) and hexaazatriphenylene, or a metal material such as V$_2$O$_5$, MoOx and WO$_3$. The p-type host material may be made of a material capable of delivering holes including, but is not limited to, at least one of NPD(N,N-dinaphthyl-N,N'-diphenyl benzidine)(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine) and MTDATA(4,4',4-Tris(N-3-methylphenyl-N-phenyl-amino)-triphenylamine).

The second EL unit 142 is disposed on the first charge generating layer 161. The second EL unit 142 includes a third hole transport layer HTL3, a second organic light-emitting layer R-EML, a third organic light-emitting layer YG-EML1, a fourth organic light-emitting layer YG-EML2, and a second electron transport layer ETL2. The second organic light-emitting layer R-EML, the third organic light-emitting layer YG-EML1 and the fourth organic light-emitting layer YG-EML2 may be defined as phosphorescent emitting layers.

The third hole transport layer HTL3 is disposed on the first p-type charge generating layer P-CGL1 of the first charge generating layer 161. The third hole transport layer HTL3 is an organic layer that facilitates the transfer of holes from the first p-type charge generating layer P-CGL1 into a second organic light-emitting layer R-EML, a third organic light-emitting layer YG-EML1, and a fourth organic light-emitting layer YG-EML2. The third hole transport layer HTL3 is substantially identical to the first hole transport layer HTL1 of the first EL unit 141 and the second hole transport layer HTL2 described above; and, therefore, the redundant description will be omitted.

The second electron transport layer ETL2 is disposed on the fourth organic light-emitting layer YG-EML2. The second electron transport layer ETL2 receives electrons from a second n-type charge generating layer N-CGL2 to be described below. The second electron transport layer ETL2 transfers the received electrons to the second organic light-emitting layer R-EML, the third organic light-emitting layer YG-EML1 and the fourth organic light-emitting layer YG-EML2. The second electron transport layer ETL2 is substantially identical to the first electron transport layer ETL1 of the first EL unit 141 described above; and, therefore, the redundant description will be omitted.

The second organic light-emitting layer R-EML, the third organic light-emitting layer YG-EML1 and the fourth organic light-emitting layer YG-EML2 are disposed between the third hole transport layer HTL3 and the second electron transport layer ETL2. The second organic light-emitting layer R-EML, the third organic light-emitting layer YG-EML1 and the fourth organic light-emitting layer YG-EML2 are phosphorescent emitting layers, are disposed at the positions of the second EL unit 142 where excitons are formed, and may include a material capable of emitting light of a particular color. The second organic light-emitting layer R-EML may include a material capable of emitting red light, and the third organic light-emitting layer YG-EML1 and the fourth organic light-emitting layer YG-EML2 may include a material capable of emitting yellow-green light.

The second organic light-emitting layer R-EML, the third organic light-emitting layer YG-EML1 and the fourth organic light-emitting layer YG-EML2 may have a host-dopant system, like the first organic light-emitting layer B-EML1.

Each of the second organic light-emitting layer R-EML, the third organic light-emitting layer YG-EML1 and the fourth organic light-emitting layer YG-EML2 may include a mixed host where two or more hosts are mixed, and at least one dopant. The mixed host may include a hole-type host and an electron-type host. By using the mixed host, the hosts can be uniformly deposited in the organic light-emitting layers, so that the efficiency of the organic light-emitting layers can be improved.

The second organic light-emitting layer R-EML is a phosphorescent emitting layer, may include a first hole-type host and a first electron-type host, and may be doped with a red phosphorescent dopant. That is to say, the second organic light-emitting layer R-EML may be a red light-emitting layer, and the wavelength range of light emitted from the second organic light-emitting layer R-EML may be 600 nm to 650 nm.

The red phosphorescent dopant material is a substance capable of emitting red light. The EL spectrum of the light emitted from the second organic light-emitting R-EML doped with a red phosphorescent dopant material may have a peak only in the range of red wavelength.

The red phosphorescent dopant material may be made of, but is not limited to, a material including at least one of iridium (Ir) ligand complexes including Ir(ppy)$_3$(fac tris(2-phenylpyridine)iridium), PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium) Ir(piq)3 (tris(1-phenylisoquinoline)iridium) and Ir(piq)2(acac)(bis(1-phenylisoquinoline)(acetylacetonate)iridium), PtOEP (octaethylporphyrinporphine platinum) PBD:Eu(DBM)3 (Phen) and perylene.

The third organic light-emitting layer YG-EML1 is disposed on the second organic light-emitting layer R-EML, and the fourth organic light-emitting layer YG-EML2 is disposed on the third organic light-emitting layer YG-EML1. Each of the third organic light emitting layer YG-EML1 and the fourth organic light emitting layer YG-EML2 includes the same second hole-type host and second electron-type host. However, the ratio of the second hole-type host to the second electron-type host may be different in different organic light-emitting layers.

For example, the third organic light-emitting layer YG-EML1 is disposed closer to the first electrode 130 that supplies holes than the fourth organic light-emitting layer YG-EML2 is. The fourth organic light-emitting layer YG-EML2 is disposed closer to the second electrode 150 that supplies electrons than the third organic light-emitting layer YG-EML1 is. The third organic light-emitting layer YG-EML1 may have a higher proportion of the second electron-type host in order to receive electrons efficiently, and the fourth organic light-emitting layer YG-EML2 may have a higher proportion of the second hole-type host in order to receive holes efficiently. Therefore, the ratio of the second hole-type host to the second electron-type host may vary depending on the type of carriers which is relatively difficult to reach each organic light-emitting layer.

The third organic light-emitting layer YG-EML1 and the fourth organic light-emitting layer YG-EML2 are phosphorescent emitting layers and are doped with a yellow-green phosphorescent dopant material. That is to say, the third organic light-emitting layer YG-EML1 and the fourth organic light-emitting layer YG-EML2 may be yellow-green light-emitting layers, and the wavelength range of the light emitted from the third organic light-emitting layer YG-EML1 and the fourth organic light-emitting layer YG-EML2 may be 510 nm to 590 nm.

The yellow-green phosphorescent dopant material is a material capable of emitting light in the yellow-green wavelength region. The EL spectrum of the light emitted from the third organic light-emitting layer YG-EML1 and the fourth organic light-emitting layer YG-EML2 doped with the yellow-green dopant material has a peak only in the yellow-green wavelength region, has a first peak in the red-wavelength region and a second peak in the red-wavelength region which is lower than the first peak, or has a first peak in the yellow-green wavelength region and an inflection point between the yellow-green wavelength region and the red wavelength region.

The yellow-green dopant material may be made of, but is not limited to, a material including at least one selected from the group consisting of iridium (Ir) ligand complexes including Ir(ppy)$_3$(fac tris(2-phenylpyridine)iridium)(tris(2-phenylpyridine)iridium), and Alq$_3$(tris(8-hydroxyquinolino)aluminum).

The wavelength range of the second EL unit 142 including the second organic light-emitting layer R-EML, the third organic light-emitting layer YG-EML1 and the fourth organic light-emitting layer YG-EML2 may be 510 nm to 650 nm. Specifically, the wavelength range of the second organic light-emitting layer R-EML as the red light-emitting layer may be 600 nm to 650 nm. The wavelength range of the third organic light-emitting layer YG-EML1 and the fourth organic light-emitting layer YG-EML2 as the yellow-green light-emitting layer may be from 510 nm to 590 nm when the yellow-green dopant material has a peak only in the yellow-green wavelength range. Therefore, the wavelength range of the second EL unit 142 may be 510 nm to 650 nm.

It may be advantageous that the thickness of the second EL unit 142 which is the phosphorescent EL unit is less than 1,000 Å. If the thickness of the second EL unit 142 is too large, the intensity of light emitted from the second EL unit 142 may be too strong, such that white color coordinates of the organic light-emitting diode ED may be distorted. Further, as the luminous efficiency of the first and third EL units 141 and 143, which are blue fluorescent EL units, become lower earlier, the lifetime of the organic light-emitting diode ED may be shortened. In addition, if the thickness of the second EL unit 142 is large, the overall thickness of the organic light-emitting diode ED becomes large, such that the driving voltage may rise. Therefore, the thickness of the second EL unit 142 may be 1,000 Å or less.

The second charge generating layer 162 is disposed between the second EL unit 142 and the third EL unit 143. The second charge generating layer 162 includes a second n-type charge generating layer N-CGL2 and a second p-type charge generating layer P-CGL2. The second n-type charge generating layer N-CGL2 is disposed on the second electron transport layer ETL2. The second p-type charge generating layer P-CGL2 is disposed between the second n-type charge generating layer N-CGL2 and the fourth hole transport layer. It is to be noted that the second charge generating layer 162 is substantially identical to the first charge generating layer 161 described above except for the location; and, therefore, the redundant description will be omitted.

The third EL unit 143 is disposed on the second charge generating layer 162. The third EL unit 143 includes a fourth hole transport layer HTL4, a fifth organic light-emitting layer B-EML2, and a third electron transport layer ETL3. Since the third EL unit 143 is a fluorescent emitting layer, the third EL unit 143 may be defined as a fluorescent EL unit.

The fourth hole transport layer HTL4 is disposed on the second p-type charge generating layer P-CGL2 of the second charge generating layer 162. The fourth hole transport layer HTL4 is an organic layer that facilitates transfer of holes from the second p-type charge generating layer P-CGL2 to the fifth organic light-emitting layer B-EML2. The fourth hole transport layer HTL4 is substantially identical to the first hole transport layer HTL1 of the first EL unit 141 and the second hole transport layer HTL2 described above; and, therefore, the redundant description will be omitted.

The third electron transport layer ETL3 is disposed on the fifth organic light-emitting layer B-EML2. The third hole transport layer ETL3 receives electrons from the second electrode 150. The third electron transport layer ETL3 transfers the received electrons to the first organic light-emitting layer B-EML2. The third electron transport layer ETL3 is substantially identical to the first electron transport layer ETL1 of the first EL unit 141 described above; and, therefore, the redundant description will be omitted.

The fifth organic light-emitting layer B-EML2 is disposed between the fourth hole transport layer HTL4 and the third electron transport layer ETL3. The fifth organic light-emitting layer B-EML2 is disposed at a position of the third EL unit 143 where excitons are formed, and includes a material that emits light of a particular color. The fifth organic light-emitting layer B-EML2 may include a material capable of emitting blue light.

The fifth organic light-emitting layer B-EML2 may have a host-dopant system, in which a light-emitting dopant material is doped into a host material occupying a large weight ratio so that the light-emitting dopant material has a small weight ratio.

The fifth organic light-emitting layer B-EML2 may include either a plurality of host materials or a single host material. The fifth organic light-emitting layer B-EML1 comprising a plurality of host materials or a single host material is doped with a blue fluorescent dopant material.

That is to say, the fifth organic light-emitting layer B-EML1 is a blue light-emitting layer, and the wavelength range of light emitted from the first organic light-emitting layer B-EML1 may be 440 nm to 480 nm. The blue fluorescent dopant material is substantially identical to the blue dopant material of the first organic light-emitting layer B-EML1; and, therefore, the redundant description will be omitted.

The organic light-emitting diode ED according to an exemplary embodiment of the present disclosure has a three-stack architecture in which the first EL unit 141, the second EL unit 142 and the third EL unit 143 are stacked on one another. In addition, the first EL unit 141 and the third EL unit 143 are the fluorescent EL units to emit blue light, while the second EL unit 142 is the phosphorescent EL unit to emit red light and yellow-green light. Accordingly, the organic light-emitting diode ED according to an exemplary embodiment of the present disclosure may be an organic light-emitting diode that emits white light.

The second EL unit 141 as a phosphorescent EL unit may be implemented as a host-dopant system, such that the emission zone can be determined based on the dopant concentration. As defined herein, the dopant concentration may refer to the unit of percentage by weight of the dopant. However, it is appreciated that the dopant concentration can also refer to other units, such as atomic or molar percentage of the dopant, and the like. The emission zone is closely related to the color gamut and the luminous efficiency of the organic light-emitting diode ED. Therefore, by optimizing the dopant concentration of each of the organic light-emitting layers R-EML, YG-EML1 and YG-EML2 in the second EL unit 142 as the phosphorescent EL unit, the color gamut and the luminous efficiency of the organic light-emitting diode ED can be improved. To do so, the dopant concentration may be determined so that the emission zone is not closer to any side in the second EL unit where the second organic light-emitting layer R-EML, the third organic light-emitting layer YG-EML1 and the fourth organic light-emitting layer YG-EML2 is positioned.

If the dopant concentration of the third organic light-emitting layer YG-EML1 is lower than the dopant concentration of the fourth organic light-emitting layer YG-EML2, the emission zone becomes closer to the fourth organic light-emitting layer YG-EML2 in the second EL unit 142. Accordingly, the intensity of the red light emitted from the second organic light-emitting layer R-EML may become too low, and thus the efficiency of the organic light-emitting diode ED may also be lowered.

On the other hand, if the dopant concentration of the third organic light-emitting layer YG-EML1 is higher than that of the fourth organic light-emitting layer YG-EML2, the emission zone may be formed around the third organic light-emitting layer YG-EML1 disposed at the center of the second EL unit 142. As a result, the intensity of light emitted from each of the second organic light-emitting layer R-EML, the third organic light-emitting layer YG-EML1, and the fourth organic light-emitting layer YG-EML2 can be evenly distributed. Accordingly, it may be effective that the dopant concentration of the third organic light-emitting layer YG-EML1 is higher than the dopant concentration of the fourth organic light-emitting layer YG-EML2.

Incidentally, the emission zone of each organic light-emitting layer may vary depending on the current density. For example, as the current density decreases, the emission zone may be reduced rapidly. The emission zone of each organic light-emitting layer may be determined depending on the concentration of the dopant doped in the organic light-emitting layer. When the concentration of the dopant is optimized, the emission zone of the organic light-emitting layer can be distributed widely, so that the emission zone may be reduced less even if the current density decreases. As a result, when the dopant concentration is optimized, the efficiency of the organic light-emitting diode ED can be constant over a wide range of current density, i.e., a wide range of driving voltage.

Thus, it is possible to avoid the emission zone from being reduced by way of optimizing the concentration of the dopant in the third organic light-emitting layer YG-EML1 and the fourth organic light-emitting layer YG-EML2, which are the center of the emission zone of the second EL unit 142. As described above, it may be effective that the dopant concentration of the third organic light-emitting layer YG-EML1 is higher than the dopant concentration of the fourth organic light-emitting layer YG-EML2. Hereinafter, uniformity of luminous efficiency according to the dopant concentration of the third organic light-emitting layer YG-EML1 and the dopant concentration of the fourth organic light-emitting layer YG-EML2 will be described discussed.

Figure 3A:
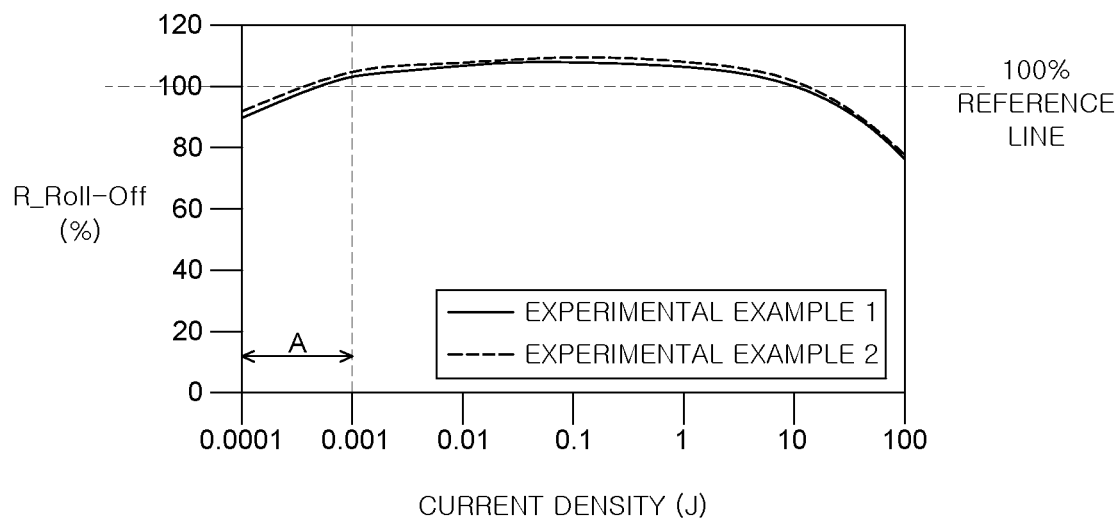
FIGS. 3A and 3B are graphs showing efficiency roll-off versus current density according to an exemplary embodiment of the present disclosure.
Figure 3B:
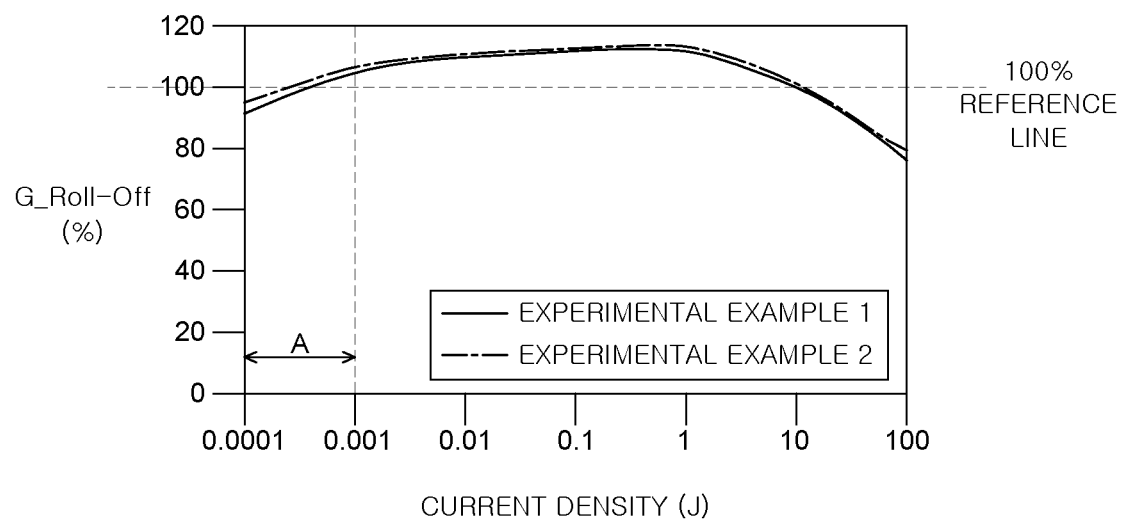

FIGS. 3A and 3B are graphs showing efficiency roll-off versus current density according to an exemplary embodiment of the present disclosure. Specifically, FIG. 3A shows the efficiency roll-off for red emission versus current density measured by varying the dopant concentration of the fourth organic light-emitting layer YG-EML2 in the stack architecture of the organic light-emitting diode ED shown in FIG. 2. FIG. 3B shows efficiency roll-off for green emission versus current density measured by varying the dopant concentration of the third organic light-emitting layer YG-EML1 in the stack architecture of the organic light-emitting diode ED shown in FIG. 2.

In the graphs shown in FIGS. 3A and 3B, the horizontal axis represents the current density in J, and the vertical axis represents the efficiency roll-off in %. In Experimental Example 1, the dopant concentration of the third organic light-emitting layer YG-EML1 was 22%, and the dopant concentration of the fourth organic light-emitting layer YG-EML2 was 12%. In Experimental Example 2, the dopant concentration of the third organic light-emitting layer YG-EML1 was 22%, and the dopant concentration of the fourth organic light-emitting layer YG-EML2 was 15%. That is to say, in Experimental Examples 1 and 2, the dopant concentration of the third organic light-emitting layer YG-EML1 was constant, whereas only the dopant concentration of the fourth organic light-emitting layer YG-EML2 was varied.

The efficiency roll-off exhibits the uniformity of luminous efficiency within a particular current density range. The efficiency roll-off is expressed in a relative value to the reference luminance (cd/A), which is 100% at the current density of 10 J. For example, when the organic light-emitting diode has the luminance of 100 cd/A at the current density of 10 J, 100 cd/A may be defined as the reference luminance of 100%. If another organic light-emitting diode to be measured has the luminance of 80 cd/A at the current density of 0.1 J, which is 80% of 100 cd/A, the vertical axis may have the value of 80% when the horizontal axis is 0.1 J on the graph. Accordingly, it can be seen that the luminous efficiency becomes uniform in a wider current density region as a curve on the graph is closer to the reference line of 100%.

Referring to FIGS. 3A and 3B, it can be seen that the uniformity of the red luminous efficiency and the uniformity of the green luminous efficiency are not substantially changed according to change in the dopant concentration of the fourth organic light-emitting layer YG-EML2. In particular, in a low current density region A between 0.0001 J and 0.001 J, the efficiency roll-off of Experimental Example 2 is slightly higher than that of Experimental Example 1. However, such a change is ignorable in the entire graph. Therefore, even if the dopant concentration of the fourth organic light-emitting layer YG-EML2 is changed, the change in the uniformity of luminous efficiency is trivial. Therefore, it may be difficult to improve the efficiency of the organic light-emitting diode ED by way of changing the dopant concentration of the fourth organic light-emitting layer YG-EML2.

Figure 4A:
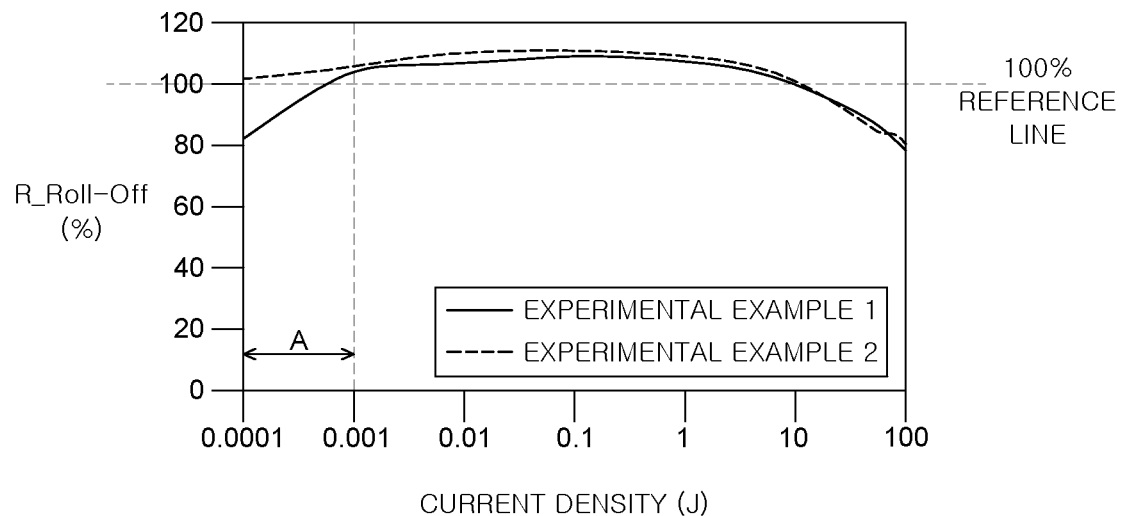
FIGS. 4A and 4B are graphs showing efficiency roll-off versus current density according to an exemplary embodiment of the present disclosure.
Figure 4B:
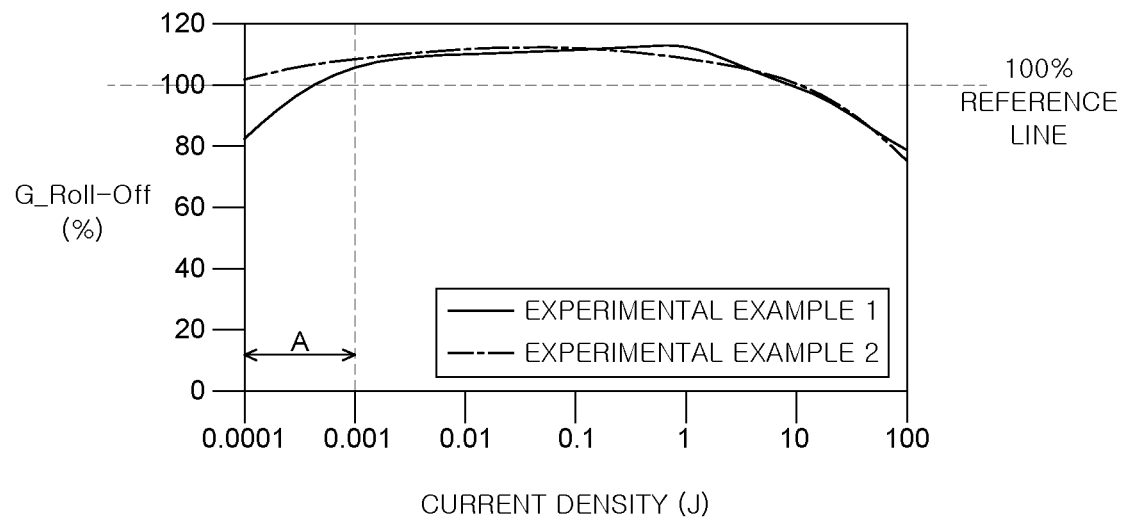

FIGS. 4A and 4B are graphs showing efficiency roll-off versus current density according to an exemplary embodiment of the present disclosure. Specifically, FIG. 4A shows the efficiency roll-off for red emission versus current density measured by varying the dopant concentration of the third organic light-emitting layer YG-EML1 in the stack architecture of the organic light-emitting diode ED shown in FIG. 2. FIG. 4B shows efficiency roll-off for green emission versus current density measured by varying the dopant concentration of the third organic light-emitting layer YG-EML1 in the stack architecture of the organic light-emitting diode ED shown in FIG. 2.

In the graphs shown in FIGS. 4A and 4B, the horizontal axis represents the current density in J, and the vertical axis represents the efficiency roll-off in %. In Experimental Example 1 that employs an organic light-emitting diode ED according to an exemplary embodiment of the present disclosure, the dopant concentration of the third organic light-emitting layer YG-EML1 was 22%, whereas the dopant concentration of the fourth organic light-emitting layer YG-EML2 was 15%. In Experimental Example 2 that employs the organic light-emitting diode ED according to the exemplary embodiment of the present disclosure, the dopant concentration of the third organic light-emitting layer YG-EML1 was 25%, whereas the dopant concentration of the fourth organic light-emitting layer YG-EML2 was 15%. That is to say, in Experimental Examples 1 and 2, the dopant concentration of the fourth organic light-emitting layer YG-EML2 was constant, whereas only the dopant concentration of the third organic light-emitting layer YG-EML1 was varied.

Referring to FIGS. 4A and 4B, it can be seen that the efficiency roll-off has been changed more than in FIGS. 3A and 3B according to change in the dopant concentration of the third organic light-emitting layer YG-EML1. In particular, in a low current density region between 0.0001 J and 0.001 J, the efficiency roll-off of Experimental Example 2 is significantly higher than that of Experimental Example 1. Therefore, if the dopant concentration of the third organic light-emitting layer YG-EML1 is changed, the change in the uniformity of luminous efficiency is also greatly changed. Therefore, it may be advantageous to improve the efficiency of the organic light-emitting diode ED by way of changing the dopant concentration of the third organic light-emitting layer YG-EML1.

Hereinafter, with reference to FIGS. 5A and 5B, a tendency of change in the efficiency roll-off according to change in the dopant concentration of the third organic light-emitting layer YG-EML1 of an organic light-emitting diode ED according to an exemplary embodiment of the present disclosure will be described in detail.

Figure 5A:
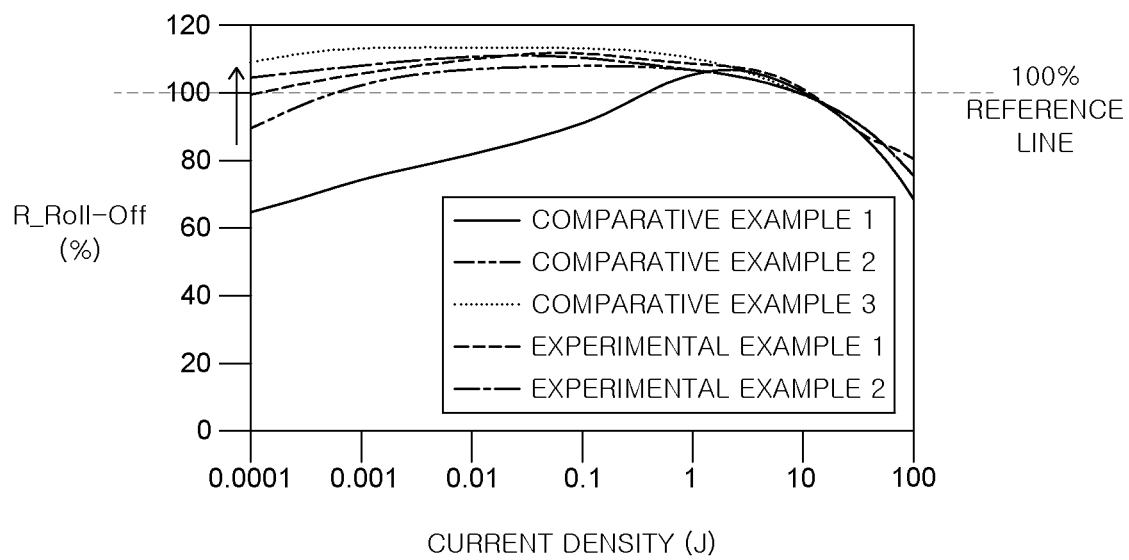
FIGS. 5A and 5B are graphs showing the efficiency roll-off versus current density in Comparative Examples 1 to 3 and Experimental Examples 1 and 2 according to an exemplary embodiment of the present disclosure.
Figure 5B:
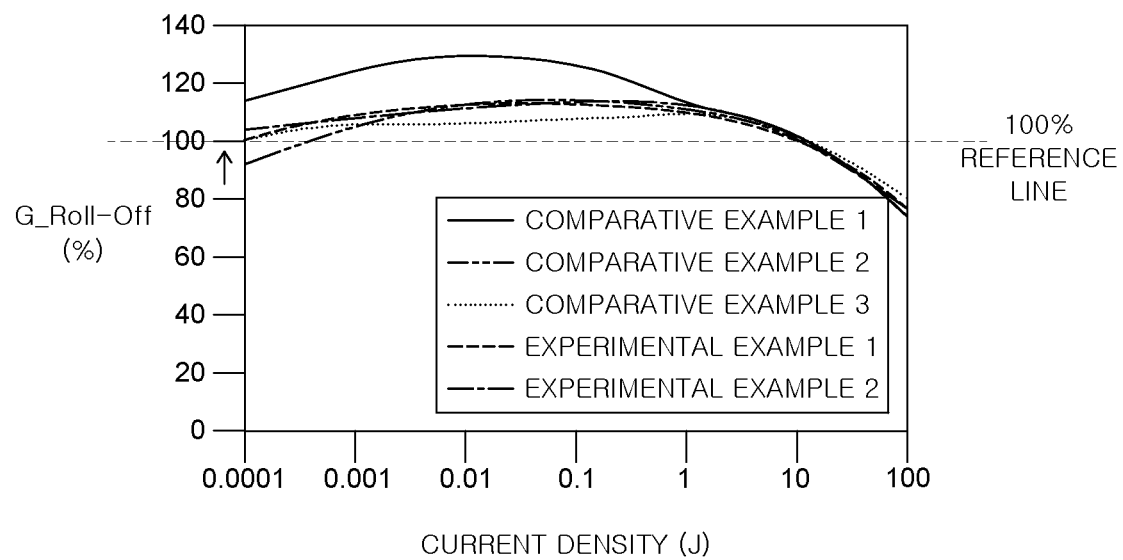

FIGS. 5A and 5B are graphs showing the efficiency roll-off versus current density in Comparative Examples 1 to 3 and Experimental Examples 1 and 2 according to an exemplary embodiment of the present disclosure. Specifically, FIG. 5A shows the efficiency roll-off for red emission versus current density measured by varying the dopant concentration of the third organic light-emitting layer YG-EML1 in the stack architecture of the organic light-emitting diode ED shown in FIG. 2. FIG. 5B shows efficiency roll-off for green emission versus current density measured by varying the dopant concentration of the third organic light-emitting layer YG-EML1 in the stack architecture of the organic light-emitting diode ED shown in FIG. 2.

In the graphs shown in FIGS. 5A and 5B, the horizontal axis represents the current density in J, and the vertical axis represents the efficiency roll-off in %. Specifically, in Comparative Example 1 that employs the stack architecture of the organic light-emitting diode ED shown in FIG. 2, the dopant concentration of the third organic light-emitting layer YG-EML1 was 20%, whereas the dopant concentration of the fourth organic light-emitting layer YG-EML2 was 15%. In Comparative Example 2 that employs the stack architecture of the organic light-emitting diode ED shown in FIG. 2, the dopant concentration of the third organic light-emitting layer YG-EML1 was 22%, whereas the dopant concentration of the fourth organic light-emitting layer YG-EML2 was 15%. In Comparative Example 3 that employs the stack architecture of the organic light-emitting diode ED shown in FIG. 2, the dopant concentration of the third organic light-emitting layer YG-EML1 was 30%, whereas the dopant concentration of the fourth organic light-emitting layer YG-EML2 was 15%.

In Experimental Example 1 that employs an organic light-emitting diode ED according to an exemplary embodiment of the present disclosure, the dopant concentration of the third organic light-emitting layer YG-EML1 was 25%, whereas the dopant concentration of the fourth organic light-emitting layer YG-EML2 was 15%. In Experimental Example 2 that employs the organic light-emitting diode ED according to the exemplary embodiment of the present disclosure, the dopant concentration of the third organic light-emitting layer YG-EML1 was 28%, whereas the dopant concentration of the fourth organic light-emitting layer YG-EML2 was 15%. That is to say, in Comparative Examples and Experimental Examples, the dopant concentration of the fourth organic light-emitting layer YG-EML2 was constant, i.e., 15%, whereas only the dopant concentration of the third organic light-emitting layer YG-EML1 was varied.

Referring to FIG. 5A, it can be seen that the efficiency roll-off for red emission was maintained over the reference line of 100% in the current density range of 10 J to 0.0001 J in Comparative Example 3 and Experimental Examples 1 and 2. When the efficiently roll-off is equal to or greater than the reference line of 100%, the luminance is constant even if the current density varies. Therefore, in Comparative Example 3, Experimental Examples 1 and 2 in which the uniformity of luminous efficiency is maintained over the reference line of 100%, the luminance can be kept constant even if the current density varies, and thus the uniformity of red luminous efficiency has been improved.

Referring to FIG. 5B, it can be seen that the efficiency roll-off for green emission was maintained over the reference line of 100% in the current density range of 10 J to 0.0001 J in Comparative Examples 1 and 3 and Experimental Examples 1 and 2, except Comparative Example 2. Therefore, in Comparative Examples 1 and 3 and Experimental Examples 1 and 2, the uniformity of luminous efficiency can be maintained constant. Accordingly, it can be seen that the uniformity of green luminous efficiency has been improved.

It can be seen from FIGS. 5A and 5B that the uniformity of the red luminous efficiency and the uniformity of the green luminous efficiency has been improved in all of Comparative Example 3 and Experimental Examples 1 and 2. In addition, it can be seen that the dopant concentrations of the third organic light-emitting layer YG-EML1 were 30%, 25% and 28% in Comparative Example 3 and Experimental Examples 1 and 2, respectively, which are above 25%. It can be seen from the above that the uniformity of luminous efficiency of the organic light-emitting diode ED can be improved only when the doping concentration of the third organic light-emitting layer YG-EML1 in the stack architecture of the organic light-emitting diode ED shown in FIG. 2 is equal to or greater than 25%. Therefore, as the dopant concentration of the third organic light-emitting layer YG-EML1 is 25% or higher as in Experimental Examples 1 and 2 of the organic light-emitting diode ED according to the exemplary embodiment of the present disclosure, the uniformity of luminous efficiency can be improved in the organic light-emitting diode ED according to the exemplary embodiment of the present disclosure.

Figure 6:
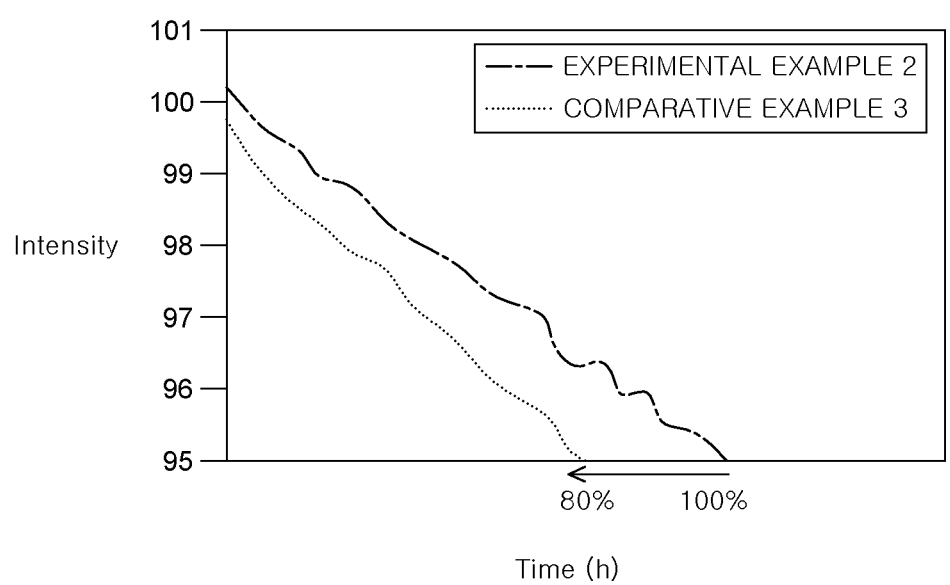
FIG. 6 is a graph showing lifetime characteristics according to dopant concentration in an organic light-emitting diode according to an exemplary embodiment of the present disclosure.

FIG. 6 is a graph showing lifetime characteristics according to dopant concentration in an organic light-emitting diode ED according to an exemplary embodiment of the present disclosure. Specifically, FIG. 6 shows the intensity over time in Experimental Example 2 and Comparative Example 3 with improved uniformity of luminous efficiency as seen from FIGS. 5A and 5B.

In FIG. 6, the horizontal axis represents time and the vertical axis represents intensity. In Experimental Example 2 that employs the organic light-emitting diode ED according to the exemplary embodiment of the present disclosure, the dopant concentration of the third organic light-emitting layer YG-EML1 was 28%, whereas the dopant concentration of the fourth organic light-emitting layer YG-EML2 was 15%. In Comparative Example 3 that employs the stack architecture of the organic light-emitting diode ED shown in FIG. 2, the dopant concentration of the third organic light-emitting layer YG-EML1 was 30%, whereas the dopant concentration of the fourth organic light-emitting layer YG-EML2 was 15%. In addition, in Experimental Example 2 and Comparative Example 3 that employs the organic light-emitting diode ED with improved uniformity of luminous efficiency as seen from FIGS. 5A and 5B, the dopant concentration of the fourth organic light-emitting layer YG-EML2 was constant, i.e., 15%, whereas only the dopant concentration of the third organic light-emitting layer YG-EML1 was varied.

Referring to FIG. 6, it can be seen that the lifetime of the organic light-emitting diode ED of Comparative Example 3 has been reduced to approximately 80% of that of Experimental Example 2. Referring to FIGS. 5A and 5B, it can be seen that the uniformity of luminous efficiency of the organic light-emitting diode ED of Comparative Example 3 is improved, but the lifetime is rather reduced. It can be seen from the above that the uniformity of luminous efficiency of the organic light-emitting diode ED can be improved without reducing the lifetime only when the doping concentration of the third organic light-emitting layer YG-EML1 in the stack architecture of the organic light-emitting diode ED shown in FIG. 2 is less than 28%.

Therefore, in order to improve the uniformity of luminous efficiency without reducing the lifetime, the dopant concentration of the third organic light-emitting layer YG-EML1 of the organic light-emitting diode ED according to the exemplary embodiment of the present disclosure may be 28% or less.

Figure 7:
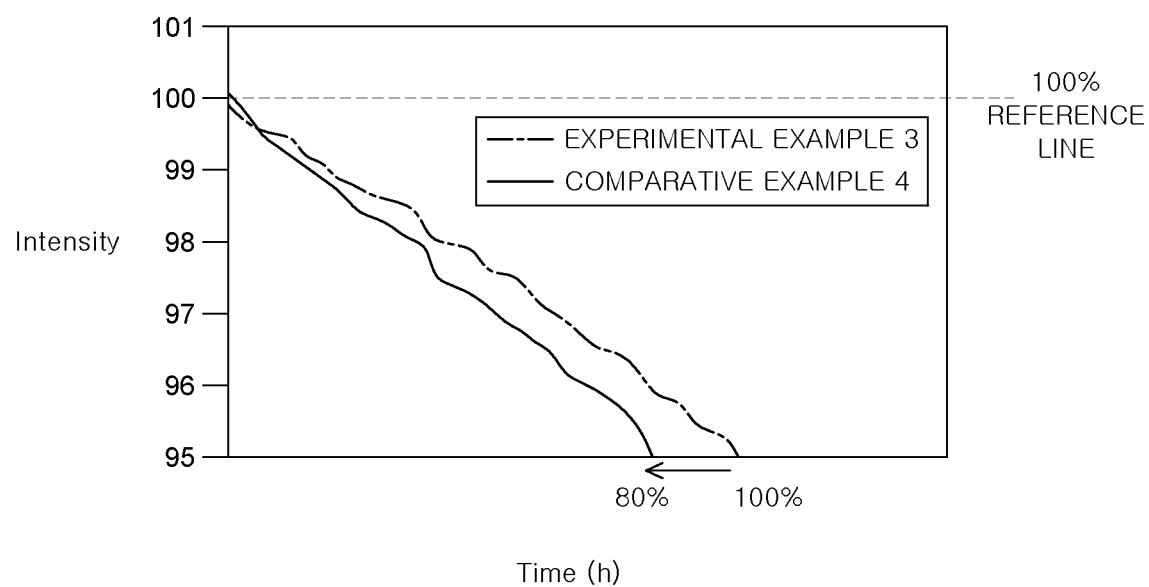
FIG. 7 is a graph showing lifetime characteristics according to dopant concentration in an organic light-emitting diode according to an exemplary embodiment of the present disclosure.

FIG. 7 is a graph showing lifetime characteristics according to dopant concentration in an organic light-emitting diode ED according to an exemplary embodiment of the present disclosure. Specifically, FIG. 7 shows intensity over time measured by varying the dopant concentration of the fourth organic light-emitting layer YG-EML2 in the stack architecture of the organic light-emitting diode ED shown in FIG. 2.

In FIG. 7, the horizontal axis represents time and the vertical axis represents intensity. In Experimental Example 3 that employs an organic light-emitting diode ED according to an exemplary embodiment of the present disclosure, the dopant concentration of the third organic light-emitting layer YG-EML1 was 25%, whereas the dopant concentration of the fourth organic light-emitting layer YG-EML2 was 12%. In Comparative Example 4 that employs the stack architecture of the organic light-emitting diode ED shown in FIG. 2, the dopant concentration of the third organic light-emitting layer YG-EML1 was 25%, whereas the dopant concentration of the fourth organic light-emitting layer YG-EML2 was 8%. That is to say, in Experimental Example 3 and Comparative Example 4, the dopant concentration of the third organic light-emitting layer YG-EML1 was constant, i.e., 25%, whereas only the dopant concentration of the fourth organic light-emitting layer YG-EML2 was varied.

Referring to FIG. 7, it can be seen that the lifetime of the organic light-emitting diode ED of Comparative Example 4 has been reduced to approximately 80% of that of Experimental Example 3. Referring to FIGS. 5A and 5B, it can be seen that the dopant concentration of the third organic light-emitting layer YG-EML1 of Experimental Example 3 and Comparative Example 4 is 25%, and thus the uniformity of luminous efficiency has been improved. Accordingly, it can be seen that although the uniformity of luminous efficiency is improved in Comparative Example 4, the lifetime is rather reduced. It can be seen from the above that the uniformity of luminous efficiency of the organic light-emitting diode ED can be improved without reducing the lifetime only when the doping concentration of the fourth organic light-emitting layer YG-EML2 is above 12% when the dopant concentration of the third organic light-emitting layer YG-EML1 ranges from 25% to 28% in the stack architecture of the organic light-emitting diode ED shown in FIG. 2.

Therefore, in order to improve the uniformity of luminous efficiency without reducing the lifetime, the dopant concentration of the fourth organic light-emitting layer YG-EML2 of the organic light-emitting diode ED according to the exemplary embodiment of the present disclosure may be 12% or higher.

As can be seen from Experimental Examples 1 and 2 of FIGS. 3A, 3B, 4A and 4B, in the stack architecture of the organic light-emitting diode ED shown in FIG. 2, it may be advantageous to improve the uniformity of luminous efficiency by changing the dopant concentration of the third organic light-emitting layer YG-EML1 rather than that of the fourth organic light-emitting layer YG-EML2.

In addition, it can be seen from Comparative Examples 1 to 3 and Experimental Examples 1 and 2 that the uniformity of luminous efficiency can be improved as the dopant concentration of the third organic light-emitting layer YG-EML1 increases, especially when the dopant concentration of the third organic light-emitting layer YG-EML1 is equal to or greater than 25%.

However, if the dopant concentration of the third organic light-emitting layer YG-EML1 exceeds a certain level, the lifetime of the organic light-emitting diode ED rather deteriorates. Accordingly, as can be seen from FIG. 6, the uniformity of luminous efficiency can be improved without reducing the lifetime when the dopant concentration of the third organic light-emitting layer YG-EML1 is 28% or less.

Further, the doping concentration of the fourth organic light-emitting layer YG-EML2 is required to be lower than the dopant concentration of the third organic light-emitting layer YG-EML1 so that the emission zone is formed in the center. However, it can be seen that the lifetime of the organic light-emitting diode ED deteriorates if the dopant concentration of the fourth organic light-emitting layer YG-EML2 becomes lower than a certain level. Accordingly, as can be seen from FIG. 7, the uniformity of luminous efficiency can be improved without reducing the lifetime when the dopant concentration of the fourth organic light-emitting layer YG-EML2 is 12% or higher.

In view of the above, in the organic light-emitting diode ED according to an exemplary embodiment of the present disclosure and the organic light-emitting display device 100 including the same, the dopant concentration of the third organic light-emitting layer YG-EML1 of the organic light-emitting diode ED ranges from 25% to 28%, while the dopant concentration of the fourth organic light-emitting layer YG-EML2 ranges from 12% to the dopant concentration of the third organic light-emitting layer YG-EML1, so that the uniformity of the luminous efficiency can be improved without reducing the lifetime.

The exemplary embodiments of the present disclosure can also be described as follows:

According to an aspect of the present disclosure, an organic light-emitting diode includes: a first electrode; a first light-emitting unit (EL unit) disposed on the first electrode and comprising a first organic light-emitting layer; a first charge generating layer on the first EL unit; a second EL unit disposed on the first charge generating layer and comprising a second organic light-emitting layer, a third organic light-emitting layer and a fourth organic light-emitting layer; a second charge generating layer on the second EL unit; a third EL unit disposed on the second charge generating layer and comprising a fifth organic light-emitting layer; and a second electrode on the third EL unit. A dopant concentration of the third organic light-emitting layer is greater than a dopant concentration of the fourth organic light-emitting layer.

The first organic light-emitting layer and the fifth organic light-emitting layer may be blue light-emitting layers, the second organic light-emitting layer may be a red light-emitting layer, and the third organic light-emitting layer and the fourth organic light-emitting layer may be yellow-green light-emitting layers.

The first organic light-emitting layer and the fifth organic light-emitting layer may include a fluorescent dopant, and the second organic light-emitting layer, the third organic light-emitting layer, and the fourth organic light-emitting layer may include a phosphorescent dopant.

The dopant concentration of the third organic light-emitting layer may range from 25% to 28%.

The dopant concentration of the fourth organic light-emitting layer may range from 12% to the dopant concentration of the third organic emitting layer.

Each of the second organic light-emitting layer, the third organic light-emitting layer and the fourth organic light-emitting layer of the second EL unit may include at least two hosts, and one of the at least two hosts may be an electron-type host, and another of the at least two hosts may be a hole-type host.

A thickness of the second EL unit may be less than 1,000 Å.

According to an aspect of the present disclosure, there is provided an organic light-emitting display device including: a substrate; and an organic light-emitting diode on the substrate. The organic light-emitting diode includes a first electrode; a first fluorescent EL unit disposed on the first electrode and comprising a first hole transport layer, a first blue light-emitting layer and a first electron transport layer; a first charge generating layer on the first fluorescent EL unit; a phosphorescent EL unit disposed on the first charge generating layer and comprising a second hole transport layer, a red light-emitting layer, a first yellow-green light-emitting layer, a second yellow-green light-emitting layer and a second electron transport layer; a second charge generating layer on the phosphorescent EL unit; a second fluorescent EL unit disposed on the second charge generating layer and comprising a third hole transport layer, a second blue light-emitting layer and a third electron transport layer; and a second electrode on the second fluorescent EL unit. A dopant concentration of the first yellow-green light-emitting layer ranges from 25% to 28%.

The dopant concentration of the second yellow-green light-emitting layer may range from 12% to the dopant concentration of the first yellow-green light-emitting layer.

Each of the red light-emitting layer, the first yellow-green light-emitting layer and the second yellow-green light-emitting layer may include a hole-type host and an electron-type host.

The first yellow-green light-emitting layer may be disposed on the red light-emitting layer, and the second yellow-green light-emitting layer may be disposed on the first yellow-green light-emitting layer.

A thickness of the phosphorescent EL unit may be less than 1,000 Å.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

What is claimed is:

1. An organic light-emitting display device comprising:
a substrate; and
an organic light-emitting diode disposed on the substrate, wherein the organic light-emitting diode comprises:
  a first electrode;
  a first fluorescent light-emitting unit disposed on the first electrode and comprising a first hole transport layer, a first blue light-emitting layer, and a first electron transport layer;
  a first charge generating layer disposed on the first fluorescent light-emitting unit;
  a phosphorescent light-emitting unit disposed on the first charge generating layer and comprising a second hole transport layer, a red light-emitting layer, a first yellow-green light-emitting layer, a second yellow-green light-emitting layer, and a second electron transport layer;
  a second charge generating layer disposed on the phosphorescent light-emitting unit;
  a second fluorescent light-emitting unit disposed on the second charge generating layer and comprising a third hole transport layer, a second blue light-emitting layer, and a third electron transport layer; and
  a second electrode disposed on the second fluorescent light-emitting unit, wherein a dopant concentration of the first yellow-green light-emitting layer is greater than a dopant concentration of the second yellow-green light-emitting layer.

2. The organic light-emitting display device of claim 1, wherein the dopant concentration of the first yellow-green light-emitting layer ranges from 25% to 28%.

3. The organic light-emitting display device of claim 1, wherein the dopant concentration of the second yellow-green light-emitting layer ranges from 12% to the dopant concentration of the first yellow-green light-emitting layer.

4. The organic light-emitting display device of claim 1, wherein each of the red light-emitting layer, the first yellow-green light-emitting layer, and the second yellow-green light-emitting layer comprises a hole-type host and an electron-type host.

5. The organic light-emitting display device of claim 1, wherein the first yellow-green light-emitting layer is disposed on the red light-emitting layer, and
wherein the second yellow-green light-emitting layer is disposed on the first yellow-green light-emitting layer.

6. The organic light-emitting display device of claim 1, wherein a thickness of the phosphorescent light-emitting unit is less than 1,000 Å.

* * * * *